(12) United States Patent
Nomura et al.

(10) Patent No.: US 9,137,904 B2
(45) Date of Patent: Sep. 15, 2015

(54) MODULE AND METHOD OF MANUFACTURING THE SAME

(71) Applicant: Murata Manufacturing Co., Ltd., Kyoto-fu (JP)

(72) Inventors: Tadashi Nomura, Kyoto-fu (JP); Yoichi Takagi, Kyoto-fu (JP); Nobuaki Ogawa, Kyoto-fu (JP); Akihiko Kamada, Kyoto-fu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/181,036

(22) Filed: Feb. 14, 2014

(65) Prior Publication Data
US 2014/0262442 A1    Sep. 18, 2014

(30) Foreign Application Priority Data
Mar. 15, 2013  (JP) .................. 2013-052680

(51) Int. Cl.
| | |
|---|---|
| H05K 1/00 | (2006.01) |
| H05K 3/40 | (2006.01) |
| H05K 1/11 | (2006.01) |
| H05K 3/24 | (2006.01) |
| H05K 3/34 | (2006.01) |

(52) U.S. Cl.
CPC .............. *H05K 3/4007* (2013.01); *H05K 1/113* (2013.01); *H01L 2224/16225* (2013.01); *H01L 2924/19105* (2013.01); *H01L 2924/19106* (2013.01); *H05K 3/243* (2013.01); *H05K 3/3436* (2013.01); *H05K 2201/09436* (2013.01); *H05K 2201/10318* (2013.01); *H05K 2201/10984* (2013.01); *H05K 2203/025* (2013.01); *H05K 2203/0346* (2013.01); *H05K 2203/1327* (2013.01)

(58) Field of Classification Search
USPC ........................................... 361/788; 174/250
See application file for complete search history.

(56) References Cited

U.S. PATENT DOCUMENTS 6,476,331 B1 * 11/2002 Kim et al. ................ 174/261

FOREIGN PATENT DOCUMENTS

| JP | 2001-094033 A | 4/2001 |
|---|---|---|
| JP | 2006-093290 A | 4/2006 |
| JP | 2007-129207 A | 5/2007 |

OTHER PUBLICATIONS

Office Action issued in Japanese Patent Application No. 2013-052680 dated Jan. 6, 2015.

* cited by examiner

*Primary Examiner* — Andargie M Aychillhum
(74) *Attorney, Agent, or Firm* — Pearne & Gordon LLP (57) ABSTRACT

A module includes a circuit board, a resin layer, an external connection conductor, a solder bump. The resin layer is disposed on a first principal surface of the circuit board. The external connection conductor is arranged in the resin layer, has a first end connected to the circuit board and a second end protruding through the surface of the resin layer and includes a projection extending along the surface of the resin layer in a portion that protrudes through the surface of the resin layer. The solder bump is disposed on the second end of the external connection conductor.

9 Claims, 7 Drawing Sheets

MODULE AND METHOD OF MANUFACTURING THE SAME

BACKGROUND OF THE INVENTION

1. Field of the Invention

The present invention relates to a module including an external connection conductor for used in external connection and a method of manufacturing the module.

2. Description of the Related Art

Figure 7:
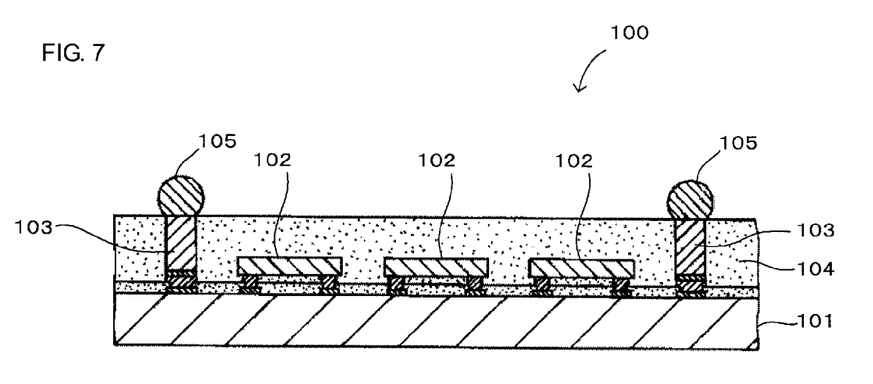
FIG. 7 is a cross-sectional view of a known module.

There is a known module that includes an external connection conductor for use in external connection, as illustrated in FIG. 7 (see, for example, paragraph Nos. 0005 to 0008 and 0012 and FIG. 16 in Japanese Unexamined Patent Application Publication No. 2001-94033). The module 100 includes a circuit board 101 with wiring electrodes formed inside and on its surface, components 102 mounted on a first principal surface of the circuit board 101, external connection conductors 103 for use in external connection, and a resin layer 104 disposed near the first principal surface of the circuit board 101 and covering the components 102 and the external connection conductors 103. The external connection conductors 103 have first ends connected to the circuit board 101 and stand on the first principal surface of the circuit board 101. The external connection conductors 103 have second end faces exposed through the surface of the resin layer 104, and solder balls 105 are formed on their respective second end faces. The external connection conductors 103 and an external mother board or other element are connected to each other through the solder balls 105, and the module 100 and the mother board are electrically connected to each other.

In the above-described known module 100, the second end face of each of the external connection conductors 103 and the surface of the resin layer 104 lie in the same plane, that is, the second end face of the external connection conductor 103 and the surface of the resin layer 104 are flush with each other, as illustrated in FIG. 7. Thus, for example, if an external stress or an internal stress, such as the one caused by heat, is exerted on the module 100 in a state where the module 100 is connected to an external mother board, the stress concentrates on the interface between the external connection conductor 103 and the solder ball 105. That is, the stress-concentrated portion and the interface overlap with each other.

The external connection conductor 103 and the solder ball 105 are considered to be connected to each other with an intermetallic compound formed by interdiffusion of the conductive material of the external connection conductor 103 and the solder in the above-described interface. This intermetallic compound typically has a low mechanical strength and is fragile. Thus if an external stress or an internal stress, such as the one caused by heat, is exerted on the module 100 in a state where the module 100 is connected to a mother board or other element, the connection between the external connection conductor 103 and the solder ball 105 may be cracked or ruptured from the interface between them as a starting point. This leads to a problem in connection reliability.

BRIEF SUMMARY OF THE INVENTION

Accordingly, it is an object of the present invention to provide a module with a high degree of reliability of external connection.

According to preferred embodiments of the present invention, a module includes a circuit board, a resin layer, and an external connection conductor. The resin layer is disposed on a first principal surface of the circuit board. The external connection conductor is arranged in the resin layer, has a first end connected to the circuit board and a second end protruding through a surface of the resin layer, and includes a projection extending along the surface of the resin layer in a portion protruding through the surface of the resin layer.

Because the second end of the external connection conductor protruding through the surface of the resin layer, for example, even if a stress is externally exerted in a state where the second end of the external connection conductor and an external mother board or other element are connected to each other through solder, the mechanically weak interface between the external connection conductor and the solder does not overlap with the stress-concentrated contact portion between the surface of the resin layer and the external connection conductor, and the stress exerted on the interface between the external connection conductor and the solder can be reduced. Accordingly, the module with a high degree of reliability of external connection can be provided.

Because the projection of the second end of the external connection conductor extends along the surface of the resin layer, the surface area (the area of the connection) of the second end of the external connection conductor for use in external connection can be widened. This can further enhance the reliability of the connection between the module and external elements.

The external connection conductor may include a supporting section and a covering section. The supporting section may be disposed in the resin layer so as to be recessed from the surface of the resin layer and have a first end connected to the circuit board. The covering section may protrude through the surface of the resin layer, be disposed on the supporting section, and include the projection extending along the surface of the resin layer in the portion protruding through the surface of the resin layer.

If the external connection conductor is made up of two members, for example, if the external connection conductor includes a supporting conductor standing on a circuit board and a pad electrode connected to an end face of the supporting conductor and exposed through the surface of a resin layer, not only the interface between the pad electrode and the solder but also the interface between the pad electrode and the supporting conductor are mechanically weak. The external connection conductor is formed by disposing the supporting section corresponding to the above-described supporting conductor in the resin layer such that the supporting section is recessed from the surface of the resin layer and then disposing the covering section corresponding to the pad electrode on the supporting section. Thus both the interface between the solder and the covering section and the interface between the covering section and the supporting section do not overlap with the stress-concentrated portion (the contact portion between the surface of the resin layer and the external connection conductor) when an external stress or an internal stress, such as the one caused by heat, is exerted. Accordingly, even when the external connection conductor includes the supporting section and the covering section, the reliability of external connection can be improved.

The covering section may be formed by plating. In this case, the covering section in the external connection conductor can be formed by general plating as a conductor forming method, and it is of practical use.

The supporting section may be made of a pin-shaped conductor. In this case, there is no need to include a via hole forming step and a step of filling the via hole with a conductor, which are necessary if the supporting section is made of a via conductor. Accordingly, the external connection conductor can be manufactured inexpensively.

The module may further include a solder bump provided on the second end of the external connection conductor. With this configuration, the module can be connected to an external element using the solder bump.

According to preferred embodiments of the present invention, a method of manufacturing a module including an external connection conductor includes a preparing step of preparing a composite substrate that includes a circuit board, a supporting conductor for forming a first conductor, and a resin layer, the supporting conductor having a first end connected to a first principal surface of the circuit board, the resin layer covering the supporting conductor and the first principal surface of the circuit board such that an end face of a second end of the supporting conductor is exposed, a first conductor forming step of forming the first conductor by removing a part of the second end of the supporting conductor such that the supporting conductor is recessed from a surface of the resin layer, and a second conductor forming step of forming a second conductor by filling a recess in the resin layer with a conductive material, the recess being formed by arranging the supporting conductor so as to be recessed from the surface of the resin layer, the second conductor protruding through the surface of the resin layer, disposed on the first conductor, and covering a peripheral region of an opening of the recess in the resin layer. The first conductor and the second conductor form the external connection conductor.

In that case, the first conductor is formed by removing the part of the second end of the supporting conductor such that the supporting conductor is recessed from the surface of the resin layer, and the second conductor protruding through the surface of the resin layer, disposed on the first conductor, and covering the peripheral region of the opening of the recess in the resin layer formed by arrangement in which the supporting conductor is recessed from the surface of the resin layer is formed by filling the recess in the resin layer with the conductive material. Accordingly, if an external stress or an internal stress, such as the one caused by heat, is exerted in a state where the module and an external mother board or other element are connected, the mechanically weak interface between the first conductor and the second conductor does not overlap with the stress-concentrated contact portion between the surface of the resin layer and the external connection conductor, and the surface of the portion forming the interface with the solder and protruding through the surface of the resin layer in the second conductor also does not overlap with the stress-concentrated portion. Thus the module with a high degree of connection reliability can be manufactured.

Because the covering section covering the peripheral region of the opening of the recess in the resin layer increases the area of connection between the external connection conductor and the solder, the module with a high degree of reliability of external connection can be manufactured.

The method of manufacturing a module may further include a covering metal film forming step of forming a covering metal film that covers a surface of the second conductor and a bump forming step of forming a solder bump on a surface of the covering metal film. In this case, because the solder bump is formed on the second end of the external connection conductor, for example, when the module and an external mother board or other element are connected to each other using solder, it is not necessary to provide the mother board with solder. Accordingly, the cost of manufacturing the mother board can be reduced.

Other features, elements, characteristics and advantages of the present invention will become more apparent from the following detailed description of preferred embodiments of the present invention with reference to the attached drawings.

DETAILED DESCRIPTION OF THE INVENTION

Figure 1:
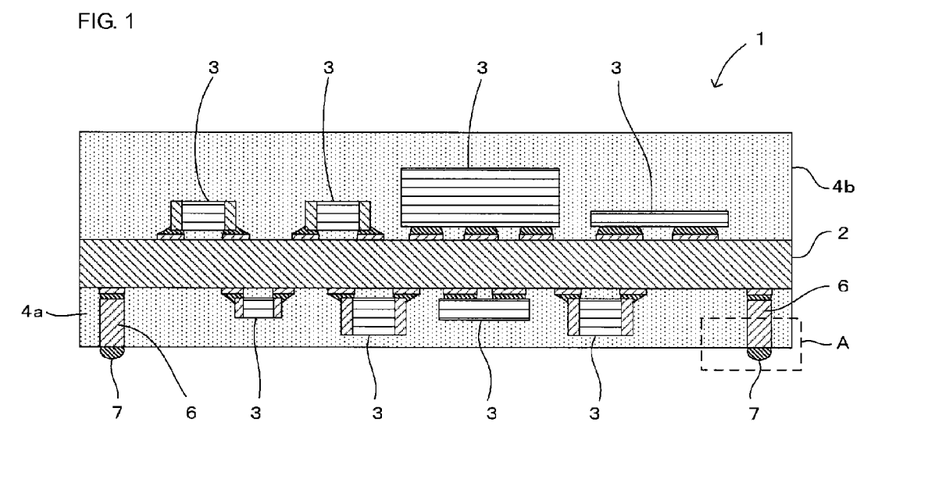
FIG. 1 is a cross-sectional view of a module according to an embodiment of the present invention.
Figure 2:
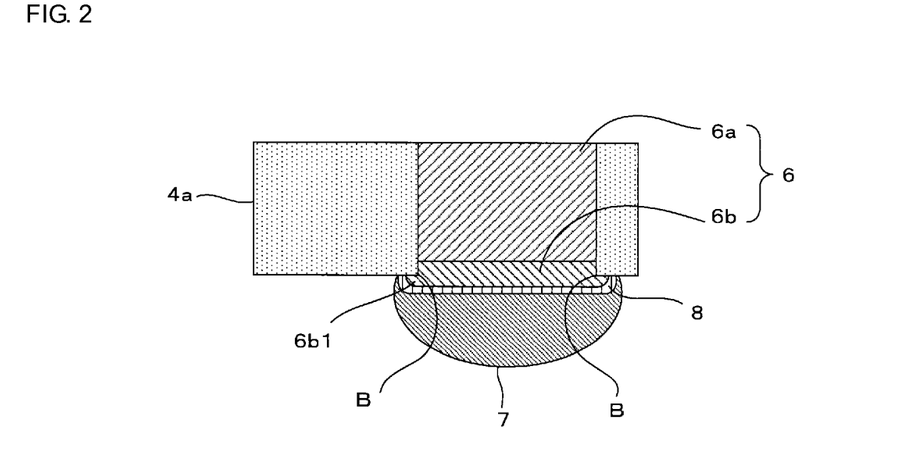
FIG. 2 is a partially enlarged view of an external connection conductor included in the module illustrated in FIG. 1.

A module according to an embodiment of the present invention is described below with reference to FIGS. 1 and 2. FIG. 1 is a cross-sectional view of a module 1 according to the present embodiment. FIG. 2 is an enlarged view of a region A in FIG. 1 and illustrates a partially enlarged view of an external connection conductor 6 included in the module 1.

(Configuration of Module 1)

The module 1 according to the present embodiment includes a circuit board 2, a plurality of electronic components 3 mounted on both principal surfaces of the circuit board 2, resin layers 4a and 4b disposed on both principal surfaces of the circuit board 2, and the external connection conductors 6 arranged in the resin layer 4a, as illustrated in FIG. 1. Each of the external connection conductors 6 has a first end connected to a first principal surface of the circuit board 2 and a second end projecting through the surface of the resin layer 4a and includes a projection 6b1 extending along the surface of the resin layer 4a in a portion projecting through the resin layer 4a. The module 1 can be used as a switch module, a communication module, such as a Bluetooth (registered trademark) module or a Wi-Fi module, or a power supply circuit module.

The circuit board 2 can be made of glass epoxy resin, low temperature co-fired ceramic (LTCC), ceramic, or glass. Wiring electrodes (not illustrated), via conductors (not illustrated), and other conductors can be formed on the surface of or in the circuit board 2. The circuit board 2 may be a multi-layer board or a single-layer board.

Examples of the electronic components 3 may include chip components, such as semiconductor elements that can be made of silicon or gallium arsenide, chip capacitors, and chip inductors. In the present embodiment, the electronic components 3 are mounted on both principal surfaces of the circuit board 2 by any known surface mounting technology.

Each of the resin layers 4a and 4b on both principal surfaces of the circuit board 2 can be made of epoxy resin. The resin layer 4a on the first principal surface of the circuit board 2 covers the first principal surface of the circuit board 2 and the electronic components 3 and the external connection conductors 6, which are described below, mounted on the first principal surface. The resin layer 4b on the second principal surface covers the second principal surface of the circuit board 2 and the electronic components 3 mounted on the second principal surface.

Each of the external connection conductors 6 is used for connecting the module 1 to an external mother board and other element, has the first end connected to the first principal surface of the circuit board 2 and the second end protruding through the surface of the resin layer 4a, and includes the projection 6b1 extending along the surface of the resin layer 4a in the portion protruding through the surface of the resin layer 4a. A solder bump 7 is disposed on the second end of the external connection conductor 6 protruding through the surface of the resin layer 4a. The external connection conductor 6 is made of a metal conductor, such as copper, aluminum, silver, nickel, or gold conductor.

Specifically, as illustrated in FIG. 2, the external connection conductor 6 includes a supporting section 6a and a covering section 6b including the projection 6b1. The supporting section 6a is disposed in the resin layer 4a so as to be recessed from the surface of the resin layer 4a and has a first end connected to the first principal surface of the circuit board 2. The covering section 6b protrudes through the surface of the resin layer 4a, is disposed on the supporting section 6a, and includes the projection 6b1 extending along the surface of the resin layer 4a in the portion protruding through the surface of the resin layer 4a. In the present embodiment, the supporting section 6a is made of a substantially pin-shaped copper conductor, and the covering section 6b is the one in which nickel plating is applied on the supporting section 6a. As illustrated in FIG. 2, the covering section 6b is formed such that a part of the covering section 6b protrudes through the surface of the resin layer 4a, and the projection 6b1 is formed in the portion protruding through the surface of the resin layer 4a such that it extends along the surface of the resin layer 4a so as to cover a part of the resin layer 4a, as described above. The supporting section 6a is not necessarily the substantially pin-shaped conductor, and it may be, for example, a via conductor formed by filling a through-hole in the resin layer 4a with conductive paste. The covering section 6b may be formed by, for example, sputtering, vapor deposition, or a printing technique using conductive paste.

A covering metal film 8 made of a metal, such as gold or tin, is disposed on the portion protruding through the surface of the resin layer 4a in the covering section 6b such that the covering metal film 8 covers the surface of that portion. The solder bump 7 is disposed on the covering metal film 8. The covering metal film 8 can also be formed by plating, sputtering, vapor deposition, or a printing technique.

The module 1 having the above-described configuration is connected to an external mother board or other element through the solder bump 7 provided to the second end of the external connection conductor 6. If an external stress or an internal stress caused by heat is exerted on the module 1 in a state where the module 1 is connected to a mother board, the stress concentrates on a contact portion B between the surface of the resin layer 4a and the external connection conductor 6 (covering section 6b) illustrated in FIG. 2.

In the present embodiment, the supporting section 6a in the external connection conductor 6 is disposed in the resin layer 4a so as to be recessed from the surface of the resin layer 4a, and the covering section 6b is disposed on the supporting section 6a so as to protrude through the surface of the resin layer 4a. Thus none of the interface between the supporting section 6a and the covering section 6b, the interface between the covering section 6b and the covering metal film 8, and the interface between the covering metal film 8 and the solder bump 7 overlap with the above-described stress-concentrated portion. If the covering metal film 8 is made of gold, because gold and solder tend to interdiffuse, when the module 1 is connected to an external mother board, for example, the interdiffusion may make the covering metal film 8 invisible.

(Method of Manufacturing Module 1)

Next, a method of manufacturing the module 1 is described with reference to FIGS. 3A to 3E. FIGS. 3A to 3E are illustrations for describing a method of manufacturing the external connection conductor 6 included in the module 1 and correspond to FIG. 2. FIGS. 3A to 3E illustrate the steps in the method of manufacturing the external connection conductor.

Figure 3A:
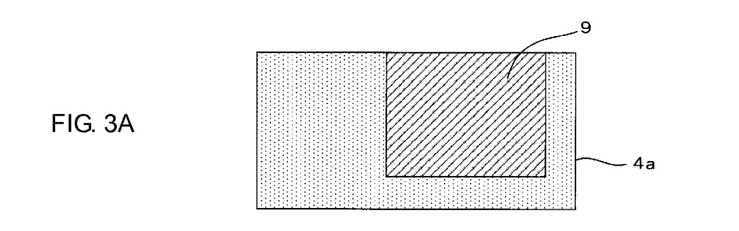
FIGS. 3A to 3E are illustrations for describing a method of manufacturing the external connection conductor.

First, a composite substrate is prepared that includes the circuit board 2, the plurality of electronic components 3 mounted on both principal surfaces of the circuit board 2, a supporting conductor 9 having a first end connected to the first principal surface of the circuit board 2, the resin layer 4a covering the supporting conductor 9, the electronic components 3, and the first principal surface of the circuit board 2 such that a second end of the supporting conductor 9 is exposed, and the resin layer 4b covering the second principal surface of the circuit board 2 and the electronic components 3 mounted on the second principal surface (corresponding to a preparing step in the present invention).

Specifically, the electronic components 3 and the supporting conductor 9, which is a substantially pin-shaped copper conductor, are mounted on the first principal surface of the circuit board 2 using known surface mounting technology, and the electronic components 3 are mounted on the second principal surface using known surface mount technology.

Then, the resin layer 4a and the resin layer 4b are formed on the first principal surface and the second principal surface of the circuit board 2, respectively, using a coating method, a printing method, a compression molding method, a transfer molding method, or other method. At this time, as illustrated in FIG. 3A, the resin layer 4a is formed so as to cover the entire portion of the supporting conductor 9. In the preparing step, first, the supporting conductor 9 and the electronic components 3 may be mounted on the first principal surface of the circuit board 2 and the resin layer 4a may be formed, then, the electronic components 3 may be mounted on the second principal surface of the circuit board 2, and lastly, the resin layer 4b may be formed, or first, the electronic components 3 may be mounted on the second principal surface of the circuit board 2 and the resin layer 4b may be formed, then, the electronic components 3 may be formed on the first principal surface of the circuit board 2, and lastly, the resin layer 4a may be formed. The resin layer 4a does not necessarily cover the entire portion of the supporting conductor 9. The resin layer 4a may be formed such that the second end of the supporting conductor 9 is exposed through its surface.

Figure 3B:
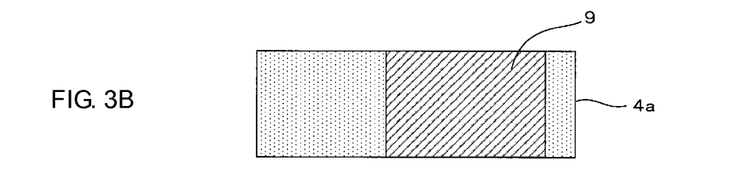

Then, as illustrated in FIG. 3B, the surface of the resin layer 4a is polished or ground such that the end face of the second end of the supporting conductor 9 is exposed through the surface of the resin layer 4a.

Figure 3C:
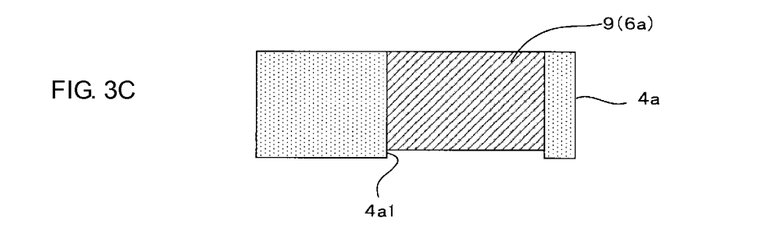

Then, as illustrated in FIG. 3C, the supporting section 6a (corresponding to a first conductor in the present invention) in the external connection conductor 6 is formed by removing a part of the second end of the supporting conductor 9 by etching such that the supporting conductor 9 is recessed from the surface of the resin layer 4a (a first conductor forming step). At the same time, burrs in the columnar conductor 9 formed in polishing or grinding the surface of the resin layer 4a are removed. The removal of the part of the second end of the supporting conductor 9 forms a recession 4a1 in the resin layer 4a.

Figure 3D:
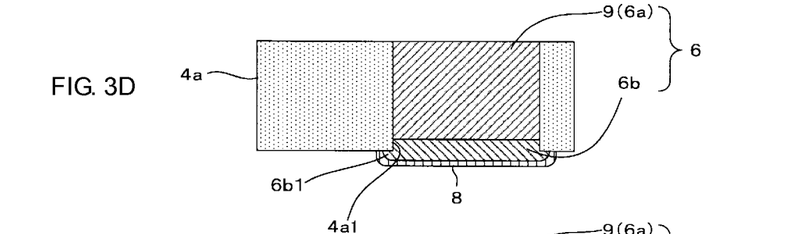

Then, as illustrated in FIG. 3D, the covering section 6b (corresponding to a second conductor in the present invention) in the external connection conductor 6 is formed by filling the recession 4a1 in the resin layer 4a with nickel plating on the supporting section 6a (a second conductor forming step). At this time, the covering section 6b is formed such that it partially protrudes through the surface of the resin layer 4a and covers the peripheral region of the opening of the recession 4a1 in the resin layer 4a. The covering section 6b is formed in this way, thus forming the projection 6b1 extending along the surface of the resin layer 4a in the covering section 6b. Then, the covering metal film 8 is formed by gold plating on the surface of a portion of the covering section 6b that protrudes through the surface of the resin layer 4a (a covering metal film forming step). The covering section 6b may be formed by sputtering, evaporation, or a printing technique using conductive paste.

Figure 3E:
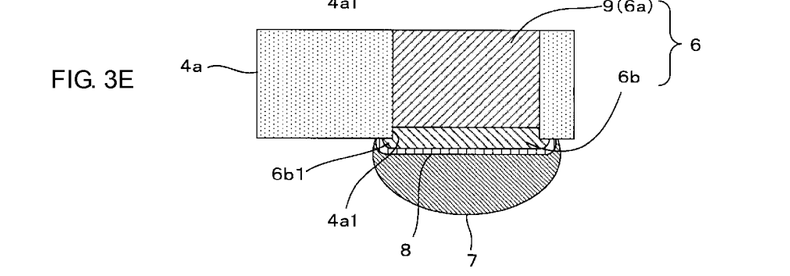

Lastly, as illustrated in FIG. 3E, the solder bump 7 is formed on the covering metal film 8 by, for example, printing using solder paste (a bump forming step). In this way, the module 1 is manufactured.

The supporting section 6a in the external connection conductor 6 may be made of a via conductor. In this case, the electronic components 3 are formed on the first principal surface of the circuit board 2, and then the resin layer 4a is formed. After that, a through-hole (via hole) is formed in a predetermined position in the resin layer 4a by a laser or other device, the through-hole is filled with conductive paste, and the via conductor is formed. Then, a part of the via conductor adjacent to the surface of the resin layer 4a is removed by, for example, etching, and the recession 4a1 is formed in the surface of the resin layer 4a.

According to the above-described embodiment, the part of the second end (covering section 6b) of the external connection conductor 6 protrudes through the surface of the resin layer 4a. Accordingly, for example, even if a stress is externally exerted or an internal stress, such as the one caused by heat, is exerted, in a state where the second end (covering section 6b) of the external connection conductor 6 and an external mother board or other element are connected to each other through the solder bump 7, the interface between the external connection conductor 6 (covering section 6b) and the covering metal film 8 and the interface between the covering metal film 8 and the solder bump 7, these interfaces being mechanically weak, do not overlap with the stress-concentrated contact portion B between the surface of the resin layer 4a and the external connection conductor 6 (covering section 6b). Thus the stress exerted on both the interfaces can be reduced, and the module 1 with a high degree of reliability of external connection can be provided.

Because the projection 6b1 of the covering section 6b in the external connection conductor 6 covers the resin layer 4a, the surface area (area of connection) of the second end (covering section 6b) of the external connection conductor 6 for use in external connection can be widened. This can further enhance the reliability of connection between the module 1 and external elements.

The external connection conductor 6 is formed by disposing the supporting section 6a of the external connection conductor 6 in the resin layer 4a such that the supporting section 6a is recessed from the surface of the resin layer 4a and then disposing the covering section 6b on the supporting section 6a. Thus the mechanically weak interface between the covering section 6b and the supporting section 6a does not overlap with the stress-concentrated portion (contact portion B between the surface of the resin layer 4a and the external connection conductor 6). Accordingly, even when the external connection conductor 6 includes the supporting section 6a and the covering section 6b, the reliability of connection between the module 1 and external elements can be improved.

The covering section 6b is made of nickel, the covering metal film 8 is made of gold, and thus the connection in the interface between them can be robust. Because gold and solder are easy to interdiffuse, the connection in the interface between the covering metal film 8 and the solder bump 7 can also be robust.

The supporting section 6a in the external connection conductor 6 is made of the substantially pin-shaped conductor (supporting conductor 9), thus obviating a via hole forming step and a step for filling a via hole with a conductor, which are necessary if the supporting section 6a is made of a via conductor. Accordingly, the external connection conductor 6 can be formed inexpensively. In addition, the covering section 6b is formed by general plating as a conductor forming method, and it is of practical use.

Because the solder bump 7 is disposed on the covering metal film 8 disposed on the surface of the covering section 6b in the external connection conductor 6, the module 1 and an external element can be connected to each other using the solder bump 7.

The external connection conductor 6 in the module 1 is formed by a general technique of forming the supporting section 6a by removal of a part of the second end of the supporting conductor 9 by etching to arrange the supporting conductor 9 such that it is recessed from the surface of the resin layer 4a, then filling the recession 4a1 in the resin layer 4a formed by the arrangement in which the supporting conductor 9 is recessed from the surface of the resin layer 4a with nickel plating, and thus forming the covering section 6b protruding through the surface of the resin layer 4a, disposed on the supporting section 6a, and including the projection 6b1 covering the resin layer 4a. Accordingly, the module 1 with a high degree of reliability of external connection can be manufactured.

Forming the covering section 6b covering the peripheral region of the opening of the recession 4a1 in the resin layer 4a widens the area of connection between the external connection conductor 6 and the solder bump 7. Accordingly, the module with a high degree of reliability of external connection can be manufactured.

The covering metal film 8 covering the surface of the covering section 6b is formed, and the solder bump 7 is formed on the surface of the covering metal film 8. Thus, for example, if the module 1 and an external mother board or other elements are connected to each other using solder, there is no need to provide the mother board with solder, and the cost of manufacturing the mother board can be reduced.

(Variations of External Connection Conductor)

Figure 4:
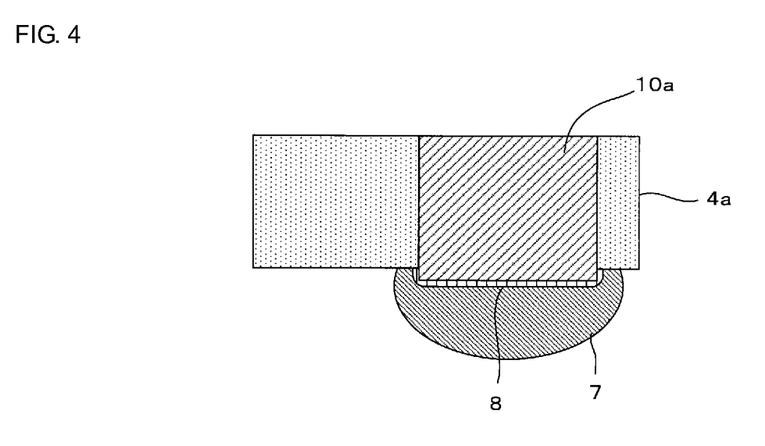
FIG. 4 illustrates one modified example of an external connection conductor.
Figure 5:
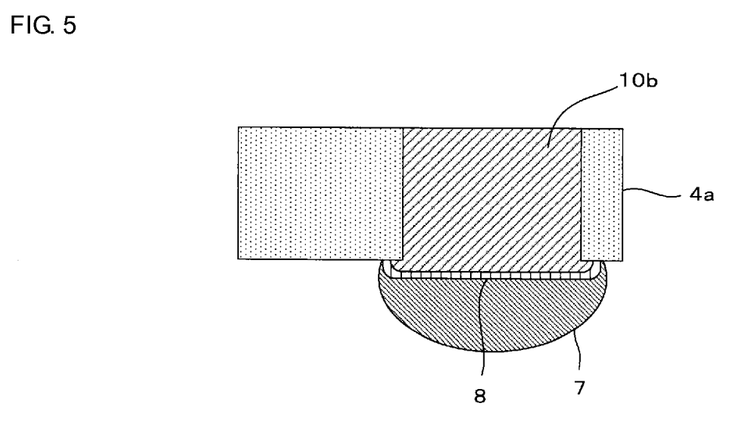
FIG. 5 illustrates another modified example of an external connection conductor.

Next, variations of the external connection conductor 6 are described with reference to FIGS. 4 and 5. FIGS. 4 and 5 illustrate variations of the external connection conductor 6 and correspond to FIG. 2.

As illustrated in FIG. 4, an external connection conductor 10a having a substantially straight shape may be formed. In this case, the external connection conductor 10a may be made of a substantially pin-shaped conductor made of, for example, copper and may include a second end partially protruding through the surface of the resin layer 4a. A portion in the external connection conductor 10a that corresponds to the supporting section 6a in the above-described embodiment may be made of a via conductor, and the remaining portion may be made of nickel plating.

As illustrated in FIG. 5, an external connection conductor 10b may be formed such that the supporting section 6a and the covering section 6b in the above-described embodiment are integrally made of the same conductor. In this case, a substantially pin-shaped conductor being substantially T shaped may be used as the external connection conductor 10b, or the external connection conductor 10b may be formed by plating or a printing technique using conductive paste.

The present invention is not limited to the above-described embodiments. In addition to the above-described ones, various changes may be made without departing from the spirit or scope of the present invention.

Figures 6A, 6B:
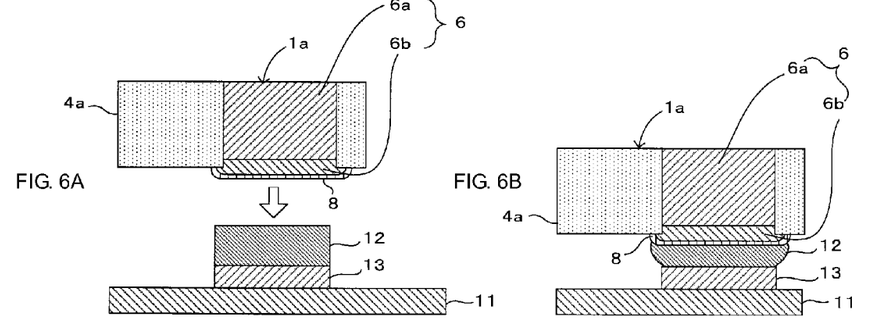
FIGS. 6A and 6B are illustrations for describing a method of connecting a module and a mother board according to another embodiment.

For example, the solder bump 7, which is provided to the external connection conductor 6 in the module 1 described in the above-described embodiments, may not be used. As illustrated in FIGS. 6A and 6B, a solder layer 12 may be formed on a predetermined mounting electrode 13 on a mother board 11 (see FIG. 6A), and the mother board 11 and a module 1a may be connected by connecting the solder layer 12 and the covering metal film 8 on the external connection conductor 6 in the module 1a (see FIG. 6B). FIGS. 6A and 6B are illustrations for describing a method of manufacturing the module 1a and the mother board 11 according to another embodiment and are cross-sectional views of the external connection conductor 6 included in the module 1a.

The present invention is applicable to various modules including external connection conductors for use in external connection.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A module comprising:
    a circuit board;
    a resin layer disposed on a first principal surface of the circuit board; and
    an external connection conductor arranged in the resin layer, having a first end connected to the circuit board and a second end protruding through a surface of the resin layer, and including a projection extending along the surface of the resin layer in a portion protruding through the surface of the resin layer,
    wherein the external connection conductor includes a supporting section and a covering section,
    wherein the supporting section is disposed in the resin layer so as to be recessed from the surface of the resin layer and has a first end connected to the circuit board, and
    the covering section protrudes through the surface of the resin layer, is disposed on the supporting section, and includes the projection extending along the surface of the resin layer in the portion protruding through the surface of the resin layer, and
    wherein the module further comprises a solder bump provided on the second end of the external connection conductor.

2. The module according to claim 1, wherein the covering section is formed by plating.

3. The module according to claim 2, wherein the supporting section is made of a pin-shaped conductor.

4. The module according to claim 2, further comprising a solder bump provided to the second end of the external connection conductor.

5. The module according to claim 1, wherein the supporting section is made of a pin-shaped conductor.

6. The module according to claim 5, further comprising a solder bump provided to the second end of the external connection conductor.

7. The module according to claim 1, further comprising a solder bump provided to the second end of the external connection conductor.

8. A method of manufacturing a module including an external connection conductor, the method comprising:
    a preparing step of preparing a composite substrate that includes a circuit board, a supporting conductor for forming a first conductor, and a resin layer, the supporting conductor having a first end connected to a first principal surface of the circuit board, the resin layer covering the supporting conductor and the first principal surface of the circuit board such that an end face of a second end of the supporting conductor is exposed;
    a first conductor forming step of forming the first conductor by removing a part of the second end of the supporting conductor such that the supporting conductor is recessed from a surface of the resin layer; and
    a second conductor forming step of forming a second conductor by filling a recess in the resin layer with a conductive material, the recess being formed by arranging the supporting conductor so as to be recessed from the surface of the resin layer, the second conductor protruding through the surface of the resin layer, disposed on the first conductor, and covering a peripheral region of an opening of the recess in the resin layer,
    wherein the first conductor and the second conductor form the external connection conductor,
    wherein the external connection conductor includes a supporting section and a covering section,
    wherein the supporting section is disposed in the resin layer so as to be recessed from the surface of the resin layer and has a first end connected to the circuit board, and
    the covering section protrudes through the surface of the resin layer, is disposed on the supporting section, and includes the projection extending along the surface of the resin layer in the portion protruding through the surface of the resin layer, and
    wherein the module further comprises a solder bump provided on the second end of the external connection conductor.

9. The method of manufacturing a module according to claim 8, the method further comprising:
    a covering metal film forming step of forming a covering metal film that covers a surface of the second conductor; and
    a bump forming step of forming a solder bump on a surface of the covering metal film.

* * * * *